United States Patent [19]
Brunson et al.

[11] Patent Number: 5,304,987
[45] Date of Patent: Apr. 19, 1994

[54] BOARD REMOVAL DETECTION CIRCUIT

[75] Inventors: Gordon R. Brunson, Broomfield; David J. Marinelli, Denver, both of Colo.

[73] Assignee: AT&T Bell Laboratories, Murray Hill, N.J.

[21] Appl. No.: 869,413

[22] Filed: Apr. 16, 1992

[51] Int. Cl.⁵ .............................................. G08B 21/00
[52] U.S. Cl. ................................... 340/654; 340/635; 340/687; 324/133; 324/158 R
[58] Field of Search ............... 340/635, 652, 653, 687, 340/654; 439/489, 490, 59; 324/133, 158 R

[56] References Cited

U.S. PATENT DOCUMENTS

| | | |
|---|---|---|
| 4,042,832 | 8/1977 | Cassarino, Jr. et al. ........ 340/653 X |
| 4,507,697 | 3/1985 | Ozil et al. ...................... 340/687 X |
| 4,949,035 | 8/1990 | Palmer, II ...................... 340/687 X |

Primary Examiner—Jeffery A. Hofsass
Attorney, Agent, or Firm—David Volejnicek

[57] ABSTRACT

In a circuit module (100) that removably plugs into a backplane carrier (11) that provides both a power connection (713) and a ground connection (714,715) to the module, a circuit (150) in the module responds to power outage on the module by using the presence or absence of the ground connection to determine whether the circuit module has been unplugged from the carrier. Upon restoration of power, a circuit (203) responds to the determination by affecting functionality of the module in one or another manner depending upon whether the module had or had not been unplugged from the carrier.

14 Claims, 2 Drawing Sheets

BOARD REMOVAL DETECTION CIRCUIT

TECHNICAL FIELD

The invention relates generally to electrical circuits for detecting the occurrence of a particular event or condition.

BACKGROUND OF THE INVENTION

Modular electronic systems that are architected as a plurality of subsystem modules individually implemented on separate circuit board that plug into a common interconnection arrangement, such as a motherboard or a back plane carrier slot, abound. The modules typically derive their power from a common source which is distributed by the interconnection arrangement. A module is typically unpowered when it is disconnected from the system, and it is powered up and functionally "comes alive" upon being connected into the system. However, the module may become unpowered even while it is connected in the system, either intentionally such as upon turning off of a power switch or accidentally such as upon occurrence of a fault that blows a protective fuse or causes an open circuit condition in the power distribution lead.

SUMMARY OF THE INVENTION

Applicants have realized that, in many instances, it is desirable for the circuitry of a module to be able to distinguish between the two conditions of (a) power loss that results from its disconnection from the system, and (b) power loss while it remains connected in the system. Reasons for the desirability of making this distinction vary from system to system. In some systems, a module may have to perform special acitivities—such as notifying a central intelligence of its presence—when it is first connected into the system, but not thereafter. In other systems, a module's characteristics may be assigned by a central intelligence when the module is first connected into the system, but not thereafter. In yet others of the systems, the functionality that is assigned to a multi-function module in the system may change upon system reconfiguration, such as upon system expansion, and the reconfiguration typically involves the connection and disconnection of subsystem modules. Furthermore, for maintenance and tracking purposes, it may be desirable to keep a count of the number of times that a module is removed from the system, or the number of times that it loses power. In all of these examples, it may be desirable for a module, when it is powered up, to be able to determine whether it had been powered down while it remained connected in the system or as a result of having been disconnected from the system.

According to the invention, there is provided a circuit, for use with a circuit module that is disconnectably connectable to a source of power, that responds to a power outage on the circuit module by determining whether the circuit module has been physically disconnected or not from the power source. Illustratively, the circuit responds to the power outage by determining whether the circuit module is (e.g., remains) grounded or not.

Preferably, a second circuit responds to the determination by affecting functionality of the circuit module when power returns to the module. The functionality is affected in a first manner—such as by being changed from a previous functionality—in response to a determination that the circuit module has been physically disconnected from the power source. The functionality is affected in a second manner different from the first manner—such as by being restored to a previous functionality—in response to a determination that the circuit module has not been physically disconnected from the power source.

The invention provides a circuit module with the capability of distinguishing between power loss due to power failure and power loss due to module disconnection. The circuitry of the module is thereby enabled to take different action appropriate for the particular power-loss situation that occurred.

These and other advantages and features of the invention will become apparent from the following description of an illustrative embodiment of the invention taken together with the drawing.

DETAILED DESCRIPTION

Figure 1:
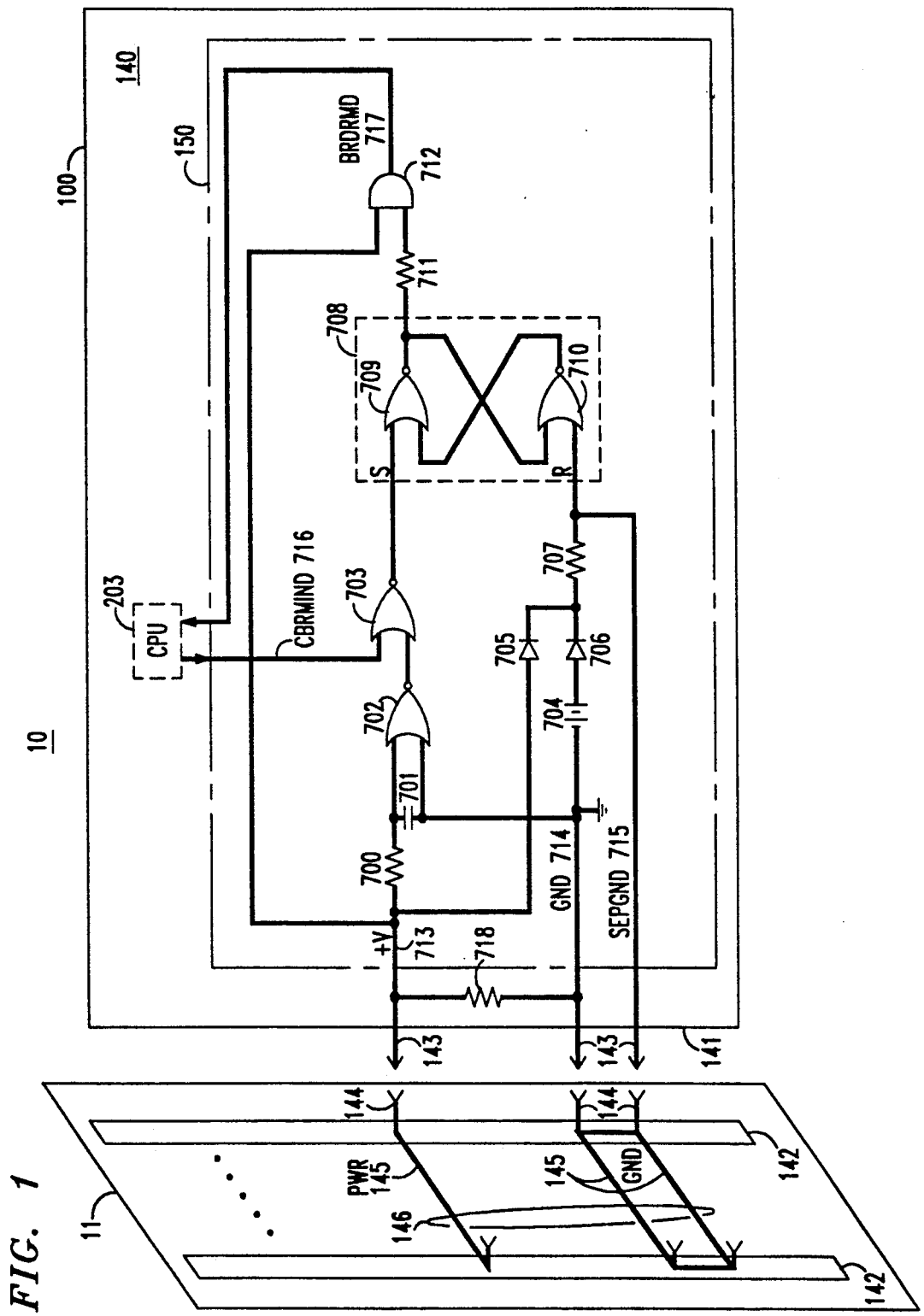
FIG. 1 shows a modular electronic system including a circuit board that includes an illustrative embodiment of the invention.

FIG. 1 shows a modular electronic system 10. System 10 is made up of one or more subsystem circuit modules 100. Modules 100 are interconnected by an interconnection arrangement 11, such as a backplane carrier, which defines a plurality of backplane slots 142. Individual modules 100 plug into individual slots 142, in a conventional manner. Illustratively, each module 100 comprises a circuit board 140 that carries connector pins 143 along one edge 141 thereof which physically mate and made electrical connections with corresponding connector sockets 144 of slots 142. Corresponding sockets 144 of the plurality of slots 142 are connected together by leads 145 of a backplane carrier bus 146. Bus 146 includes a power lead 145 for distributing power to modules 100, and one or more ground leads 145 for grounding modules 100. Each module 100 includes pins 143 for connecting to sockets 144 of the above-described leads 145.

Implemented on circuit board 140 of each module 100 is an "I've been pulled" circuit 150, along with the other circuitry of module 100 which provides the module's system 10 functions. In case of loss of power to module 100, circuit 150 uses the presence or absence of connection of pins 143 to sockets 144 of the power and ground leads 145 to determine whether the power loss occurred as a result of powering-down of the power lead 145 or as a result of disconnection of module 100 from backplane carrier 11. Circuit 150 reports its determination to an intelligence of module 100, such as central processing unit (CPU) 203.

Focusing on circuit 150, it has a +V input lead 713 that connects through a pin 143 and socket 144 to the power lead 145, and a GND input lead 714 and a SEPGND input lead 715 each one of which connects through a pin 143 and socket 144 to the one or more ground leads 145. Circuitry of module 100 provides a "ballast load" between leads 713 and 714, which is represented here by a resistor 718. +V lead 713 connects to one input of an AND logic gate 712, to an input of a diode 705, and through a resistor 700 to one input of a NOR logic gate 702. Output of gate 702 is connected to one input of a NOR logic gate 703, whose other input is connected to a reset lead 715 labeled CBRMIND. Output of gate 703 is connected to a set (S) input of an R−S flip-flop 708.

GND lead 714 is connected to a second input of gate 702, to one side of a battery 704, and through a capacitor 701 to the other input of gate 702. The other side of battery 704 is connected to an input of a diode 706. The outputs of both diodes 705 and 706 are connected through a resistor 707 to a reset (R) input of flip-flop 708. SEPGND lead 715 is connected directly to the R input of flip-flop 708.

As is conventional, R−S flip-flop 708 comprises a pair of NOR logic gates 709 and 710. One input of gate 709 is the S input of flip-flop 708, while the other input of gate 709 is connected to the output of gate 710. Similarly, one input of gate 710 is the R input of flip-flop 708, while the other input of gate 710 is connected to the output of gate 709. The output of gate 709 is also connected through a resistor 711 to a second input of gate 712. The output of gate 712 is connected to a board-removed indicator lead 711 labeled BRDRMD.

Normally, module 100, including circuit 150, is powered by external power supplied over +V lead 713. The function of battery 704 is to keep circuit 150 (optionally, with the exception of gate 712) operating in an absence of power on +V lead 713, and to enable circuit 150 to determine whether module 100 has or had not remained grounded during the power outage. The determination of whether or not module 100 has remained grounded respectively serves as a determination of whether module 100 has not or has been disconnected from a slot 142. Diode 706 prevents power on +V lead 713 form overcharging battery 704, while diode 705 prevents +V lead 713 from draining power from battery 704 while external power is absent from +V lead 713.

The R-C circuit formed by resistor 700 and capacitor 701 provides a time-delay for occurrence of a logic change at the first input of gate 702 upon application/loss of external power to/from +V lead 713. Resistor 711 limits the current drawn by gate 712 from flip-flop 708.

Gates 702, 703, 709, and 710 are low-power devices such as CMOS devices. Gate 712 is a driver, such as an HCT device, capable of driving TTL devices.

CBRMIND lead 716 is used to reset the logic of circuit 150. Normally, lead 716 is at a logic "1" level; a logic "0" pulse on lead 716, illustratively supplied by CPU 203, serves as the reset signal.

The logic level on BRDRMD lead 717 indicates, illustratively to CPU 203, whether or not module 100 has been disconnected from backplane carrier 11. A logic value of "0" on lead 717 indicates that module 100 has not been removed from a slot 142; a logic value of "1" on lead 717 indicates that module 100 has been removed from a slot 142.

When module 100 is made, the state of the logic of circuit 150 is indeterminate. But, as part of testing of module 100 prior to its use, +V lead 713 is connected to a source of power and leads 714 and 715 are grounded—same as if module 100 were to be plugged into a slot 146. This causes a logic "0" to appear at R input of flip-flop 708 and at one input of gate 702, while a logic "1" appears at the other input of gate 702 after a brief delay and causes gate 702 to output a logic "0". A logic "0" pulse is then applied to gate 703 via lead 716, resulting in a logic "1" output from gate 703 which ensures a logic "0" output from gate 709, and hence places the output of circuit 150 in a known state.

Module 100 may then be disconnected from the test arrangement. This immediately results in battery 704 raising the R input of flip-flop 708 to a logic "1", and thereby causes gate 710 to apply a logic "0" to an input of gate 709. Disconnection of module 100 also results in a loss of external power from +V lead 713, which causes both inputs to gate 702 to become "0" after a delay caused by R−C circuit 700, 718 and 701. Hence, the output of gate 702 becomes "1", and consequently the output of gate 703 becomes "0", resulting in two "0" inputs to gate 709. This causes the output of gate 709, and hence of flip-flop 708, to become "1". Because the R input of flip-flop 708 is already at "1", the change in the flip-flop 708 output value and the corresponding change in the value of the second input of gate 710 causes no change in the output of gate 710. The output of flip-flop 708 therefore remains at "1" while module 100 is unplugged.

Figure 2:
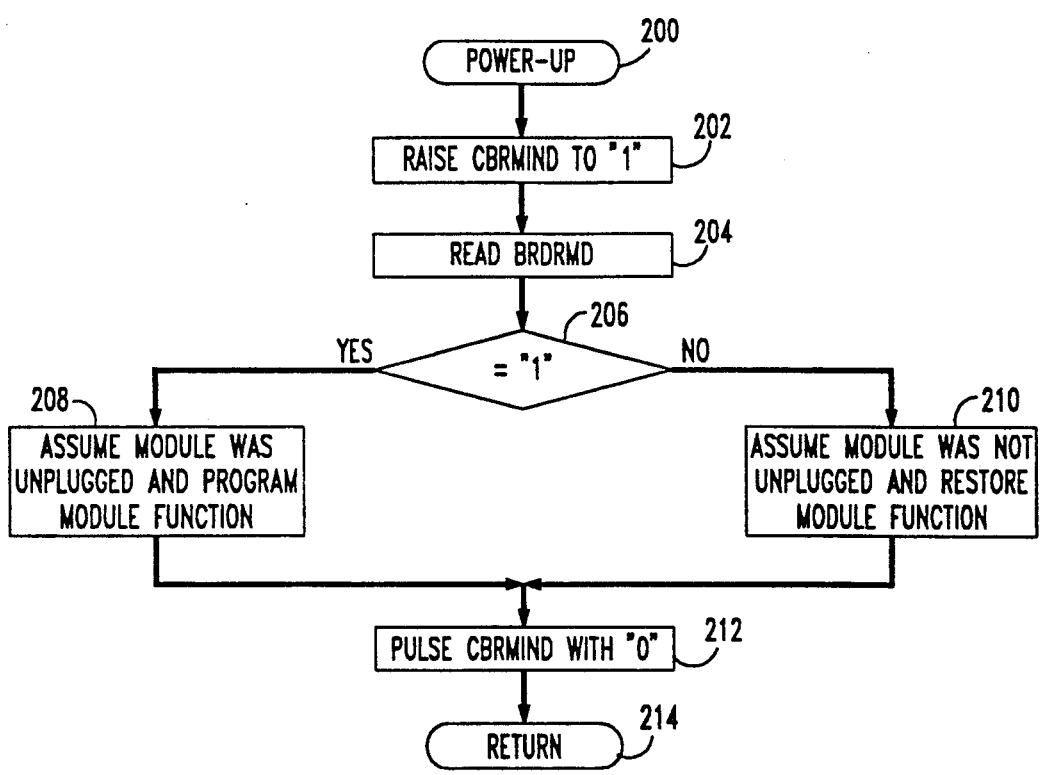
FIG. 2 is a flow diagram of a power-up routine of the CPU of the system of FIG. 1.

When module 100 is connected into system 10, +V lead 713 is powered up and leads 714 and 715 are grounded. This causes the R input of flip-flop 708 to become a logic "0". But the other input of gate 710 remains at a logic "1" and prevents this change from affecting the output of flip-flop 708. Due to the delay caused by R−C circuit 700 and 701, both inputs of gate 702 are initially at logic "0" level, producing an output of logic "1" from gate 702, which keeps the output of gate 703 at logic "0" irrespective of the value of CBRMIND lead 716. This, in turn, prevents the output of flip-flop 708 from changing from the preset logic "1" level. After the delay, one input of gate 702 reaches a logic "1" level, producing an output of logic "0" form gate 702. But, in the meantime CPU 203 will have begun to execute a power-up routine of FIG. 2, at a step 200, and will have raised lead 716 to a logic "1" level, at step 202, thereby keeping the output of gate 703 at a logic "0". CPU 203 now reads the logic state of BRDRMD lead 717, at step 204, to determine its logic value, at step 206, which is a logic "1" in this example. This indicates to CPU 203 that module 100 has been powered down on account of not having been plugged into (i.e., on account of having been unplugged from) a slot 142. CPU 203 responds in a first manner, at step 208, such as by configuring module 100 to perform a selected one of a plurality of possible functions. CPU 203 now pulses CBRMIND lead 716 with a logic "0" level, at step 212, and then returns to the point of invocation of the routine of FIG. 2, at step 214. The pulsing of CBRMIND lead 716 produces a temporary logic "1" output from gate 703. This causes gate 709 to output a logic "0" level—the reset level. This in turn results in both inputs of gate 710 becoming logic "0" and causing the output of gate 710 to become logic "1". Hence, flip-flop 708 latches the logic "0" output level and maintains it even after the output of gate 703 returns to logic "0".

When module 100 in unplugged from slot 146, the condition is the same as described for when module 100 is disconnected from the test setup, and hence the output of flip-flop 708 again becomes a logic "1".

If power is lost and +V lead 713 powers down while module 100 is plugged into a slot 142, the logic value on CBRMIND lead 716 becomes indeterminate, and therefore the output of gate 703 can become a logic "0" or "1". But the R input of flip-flop 708 is held at logic "0" by SEPGND lead 715, causing the output of gate 710 to maintain its logic "1" value and thereby preventing flip-flop 708 from changing its output, which therefore remains at logic "0".

When power returns to +V lead 713, any resultant changes in the logic value of output of gate 703 are prevented, by the logic value of "0" at the R input of flip-flop 708, from propagating through flip-flop 708, and hence the value of the output of flip-flop 708 remains at logic "0". CPU 203 again executes the routine of FIG. 2 and reads the logic state of BRDRMD lead 717, at step 204, which is logic "0" in this example. This indicates to CPU 203, at step 206, that module 100 had been powered down while it was plugged into a slot 142. CPU 203 responds in a second manner, at step 210, such as by restoring module 100 to whatever functionality it has prior to the power outage. CPU 203 now pulses CBRMIND lead 716 with a logic "0" level, at step 212, and then returns to the point of invocation of the routine of FIG. 2, at step 214. The pulsing of CBRMIND lead 716 again produces a temporary logic "1" output form gate 703. This causes gate 709 to output a logic "0" level—resulting in no change in the flip-flop 708 output.

Battery 704 is changed in a module 100 only when the module is unplugged from a slot 142. Hence, the output of flip-flop 708 is logic "1" at that time. Removal of battery 704 and substitution of a new one causes the R input of flip-flop 708 to fluctuate in value. But the other input of gate 710 remains steady at logic "1", maintaining the output of gate 710 at logic "0" and hence preventing flip-flop 708 from changing its output.

Of course, is should be understood that various changes and modifications to the illustrative embodiment described above will be apparent to those skilled int he art. For example, the battery may be replaced with a capacitor of adequate size to power the circuit for a selected time period. Or, the use to which the circuit of the invention is put may be to initiate notification of a remote service center that power has been lost, but to avoid such notification at the time that a module containing the circuit is installed. Such changes and modifications can be made without departing from the spirit and the scope of the invention and without diminishing its attendant advantages. It is therefore intended that all such changes and modifications be covered by the following claims.

We claim:

1. A circuit for use with a circuit module disconnectably connectable to a source of power, comprising:
   circuit means for detecting a power outage on the circuit module;
   circuit means capable of determining that the circuit module has been physically disconnected from the power source and also capable of determining that the circuit module has not been physically disconnected from the power source, said determining circuit means responsive to the detection of a power outage for determining whether the cause of the detected power outage is that the circuit module has been physically disconnected from the power source; and
   means responsive to the determination for indicating the determination.

2. The circuit of claim 1 further comprising
   circuit means responsive to the indicating means for affecting functionality of the circuit module in a first manner in response to an indication that the circuit module has been physically disconnected from the power source, and for affecting the functionality in a second manner different from the first manner in response to an indication that the circuit module has not been physically disconnected form the power source.

3. The circuit of claim 2 wherein
   the functionality-affecting means respond to the indicating means to affect functionality of the circuit module upon return of power to the circuit module.

4. The circuit of claim 1 wherein
   the determining means include
   an energy storage device for powering the determining means and the indicating means during the power outage; and
   the indicating means include
   means for generating an indication of the determination, and
   means for latching the generated indication.

5. The circuit of claim 1 for use with a circuit module disconnectably connectable to a source of power and to ground, wherein
   the determining means comprise
   means responsive to the detection for determining whether the circuit module is grounded or not.

6. The circuit of claim 1 for use with a circuit module having a first contact for disconnectably physically connecting the module to a source of power and a second contact for disconnectably physically connecting the module to ground, wherein
   the determining means comprise
   means responsive to absence of power from the first contact while the second contact is grounded for determining that the circuit module has not been physically disconnected from the power source, and responsive to absence of power from the first contact while the second contact is not grounded for determining that the circuit module has been physically disconnected from the power source.

7. A circuit module comprising:
   first means for physically connecting and disconnecting the circuit module to and from a source of power;
   circuit means cooperative with the first means and responsive to a power outage on the circuit module for determining whether the circuit module has been physically disconnected or not from the power source; and
   circuit means responsive to the indicating means for affecting functionality of the circuit module in a first manner in response to an indication that the circuit module has been physically disconnected from the power source, and for affecting the functionality in a second manner different from the first manner in response to an indication that the circuit module has not been physically disconnected from the power source.

8. The circuit module of claim 7 wherein
   the functionality-affecting means respond to the indication generated by the determining means to affect functionality of the circuit module upon return of power to the circuit module.

9. The circuit module of claim 7 wherein
   the first means comprise
   second means for physically connecting the module to a source of power, and
   third means for physically connecting the module to ground; and
   the determining means comprise means responsive to a power outage on the circuit module for determining whether the circuit module is grounded or not.

10. The circuit module of claim 7 wherein:

the first means comprise second means for physically connecting the module to a source of power, and third means for physically connecting the module to ground; and the determining means comprise means responsive to absence of power from the second means while the third means are grounded for generating a first indication that the circuit module has not been physically disconnected from the power source, and responsive to absence of power from the second means while the third means are not grounded for generating a second indication that the circuit module has been physically disconnected from the power source.

11. The circuit module of claim 10 wherein the indication-generating means comprise an energy storage device for powering the indication-generating means in the absence of power from the second means, and means for latching the indication generated by the indication-generating means.

12. A method of controlling a multi-function circuit module, comprising the steps of:

detecting a power outage on the circuit module;

in response to the detection, determining whether the circuit module has been physically disconnected or not from a source of the power;

in response to a determination that the circuit module has been physically disconnected, configuring the module to perform a selected one of a plurality of selectable functions; and in response to a determination that the circuit module has not been physically disconnected, restoring the module to performing a function that it had been configured to perform prior to the power outage.

13. The method of claim 12 wherein the steps responsive to the determination occur upon return of power to the circuit module.

14. A circuit for use with a circuit module that is disconnectably connectable to a source of power and having a first contact for disconnectably physically connecting the module to a source of power and a second contact for disconnectably physically connecting the module to ground, comprising:

circuit means for detecting a power outage on the circuit module;

means responsive to absence of power from the first contact while the second contact is grounded for determining that the circuit module has not been physically disconnected from the power source, and responsive to absence of power from the first contact while the second contact is not grounded for determining that the circuit module has been physically disconnected from the power source; and means responsive to the detection, for indicating the determination.

* * * * *